(12) United States Patent
Ngo et al.

(10) Patent No.: US 6,962,857 B1
(45) Date of Patent: Nov. 8, 2005

(54) SHALLOW TRENCH ISOLATION PROCESS USING OXIDE DEPOSITION AND ANNEAL

(75) Inventors: Minh-Van Ngo, Fremont, CA (US); Ming-Ren Lin, Cupertino, CA (US); Eric N. Paton, Morgan Hill, CA (US); Haihong Wang, Fremont, CA (US); Qi Xiang, San Jose, CA (US); Jung-Suk Goo, Stanford, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 242 days.

(21) Appl. No.: 10/358,966

(22) Filed: Feb. 5, 2003

(51) Int. Cl.⁷ .............................................. H01L 21/76
(52) U.S. Cl. ................................................... 438/435
(58) Field of Search ................................ 438/425, 435

(56) References Cited

U.S. PATENT DOCUMENTS

| | | | |
|---|---|---|---|
| 5,254,873 A | 10/1993 | Poon et al. | |
| 5,266,813 A | * 11/1993 | Comfort et al. | ............... 257/19 |
| 5,406,111 A | 4/1995 | Sun | |
| 5,455,194 A | 10/1995 | Vasquez et al. | |
| 5,668,044 A | 9/1997 | Ohno | |
| 5,700,712 A | 12/1997 | Schwalke | |
| 5,719,085 A | 2/1998 | Moon et al. | |
| 5,793,090 A | 8/1998 | Gardner et al. | |
| 5,837,612 A | 11/1998 | Ajuria et al. | |
| 6,013,937 A | 1/2000 | Beintner et al. | |
| 6,037,238 A | 3/2000 | Chang et al. | |
| 6,074,930 A | 6/2000 | Cho et al. | |
| 6,074,931 A | 6/2000 | Chang et al. | |
| 6,080,618 A | 6/2000 | Bergner et al. | |
| 6,080,627 A | 6/2000 | Fan et al. | |
| 6,080,637 A | 6/2000 | Huang et al. | |
| 6,087,705 A | 7/2000 | Gardner et al. | |
| 6,107,143 A | 8/2000 | Park et al. | |
| 6,136,664 A | 10/2000 | Economikos et al. | |
| 6,146,970 A | 11/2000 | Witek et al. | |
| 6,150,212 A | 11/2000 | Divakaruni et al. | |
| 6,168,961 B1 | 1/2001 | Vaccari | |
| 6,207,531 B1 | 3/2001 | Pen-Liang | |
| 6,214,696 B1 | 4/2001 | Wu | |
| 6,271,143 B1 | 8/2001 | Mendicino | |
| 6,306,722 B1 | 10/2001 | Yang et al. | |
| 6,391,731 B1 | 5/2002 | Chong et al. | |
| 6,399,512 B1 | 6/2002 | Blosse et al. | |
| 6,414,364 B2 | 7/2002 | Lane et al. | |
| 6,426,278 B1 | 7/2002 | Nowak et al. | |
| 6,456,370 B1 | 9/2002 | Ingles, Jr. | |

(Continued)

FOREIGN PATENT DOCUMENTS

EP    0 245 622 B1    11/1987

(Continued)

OTHER PUBLICATIONS

Sorab K. Ghandhi VSLI Fabrication Principles John Wiley and sons 1983 pp. 422-423.*

(Continued)

*Primary Examiner*—David S. Blum
(74) *Attorney, Agent, or Firm*—Foley & Lardner LLP

(57) ABSTRACT

A method of manufacturing an integrated circuit (IC) utilizes a shallow trench isolation (STI) technique. The shallow trench isolation technique is used in a strained silicon (SMOS) process. The liner for the trench is formed from a layer deposited in a low temperature process which reduces germanium outgassing. The low temperature process can be an LPCVD. An annealing step can be utilized to form the liner.

20 Claims, 5 Drawing Sheets

U.S. PATENT DOCUMENTS

| | | | |
|---|---|---|---|
| 6,468,853 B1 * | 10/2002 | Balasubramanian et al. | 438/221 |
| 6,498,383 B2 | 12/2002 | Beyer et al. | |
| 6,524,931 B1 | 2/2003 | Perera | |
| 6,548,261 B1 | 4/2003 | Smith et al. | |
| 6,548,361 B1 | 4/2003 | En et al. | |
| 6,566,228 B1 | 5/2003 | Beintner et al. | |
| 6,613,646 B1 | 9/2003 | Sahota et al. | |
| 6,646,322 B2 | 11/2003 | Fitzgerald | |
| 6,656,749 B1 | 12/2003 | Paton et al. | |
| 6,673,696 B1 | 1/2004 | Arasnia et al. | |
| 6,706,581 B1 * | 3/2004 | Hou et al. | 438/216 |
| 2002/0045312 A1 | 4/2002 | Zheng et al. | |
| 2002/0098689 A1 | 7/2002 | Chong et al. | |
| 2003/0049893 A1 | 3/2003 | Currie et al. | |
| 2003/0139051 A1 | 7/2003 | Andideh et al. | |
| 2004/0061161 A1 | 4/2004 | Radens et al. | |
| 2004/0089914 A1 | 5/2004 | Mouli et al. | |

FOREIGN PATENT DOCUMENTS

| | | |
|---|---|---|
| GB | 2 254 731 A | 10/1992 |
| WO | WO 02/095818 A1 | 11/2002 |
| WO | WO 02/101818 A2 * | 12/2002 ......... H01L 21/762 |

OTHER PUBLICATIONS

Stanley Wolf Silicon Prcessing for the VSLI Era vol. 1 Lattice Press 1986 pp. 57-58, 194.*

International Search Report for PCT/US2004/000982, 4 pages.

U.S. Appl. No. 10/389,456, filed Mar. 14, 2003, entitled "Shallow Trench Isolation For Strained Silicon Processes" (26 pgs.).

U.S. Appl. No. 10/341,863, filed Jan. 14, 2003, entitled "Shallow Trench Isolation for Strained Silicon Processes" (26 pgs.).

U.S. Appl. No. 10/341,848, filed Jan. 14, 2003, entitled "Post Trench Fill Oxidation Process for Strained Silicon Processes" (17 pgs.).

Written Opinion of the International Searching Authority; International Application No. PCT/US2004/007464; International Filing Date Mar. 11, 2004; 6 pgs.

International Search Report; International Application No. PCT/US2004/007464; mailed Jan. 9, 2004; 3 pgs.

U.S. Appl. No. 10/620,194, filed Jul. 15, 2003, entitled Front Side Seal to Prevent Germanium Outgassing 22 pgs.)

Ohkubo, Satoshi; Tamura Yasuyuki; Sugino, Rinji; Nakanishi, Toshiro; Sugita, Yoshihiro; Awaji, Naoki and Takasaki, Kanetake; "High Quality Ultra-Thin (4nm) Gate Oxide by UV/$O_3$ Surface Pre-Treatment of Native Oxide"; 1995 Symposium On VLSI Technology; Digest of Technical Papers; Jun. 6-8, 1995; Kyoto, Japan; 3 pgs.

Van Zant, Peter, "Microchip Fabrication", McGraw Hill, 1977, pp. 31 and 39.

Vossen, John L. and Kern, Werner, "Thin Film Processes II", Academic Press, 1991, p. 333.

Rim, K., Welser, J., Hoyt, J.L., and Gibbons, J.F., "Enhanced Hole Mobilities in Surface-channel Strained-Si p-MOSFETs", 1995 International Electron Devices Meeting Technical Digest, 5 pages.

Welser, J., Hoyt, J.L., Takagi, S. and Gibbons, J.F., "Strain Dependence of the Performance Enhancment in Strained-Si n-MOSFETs", 1994 International Electron Devices Meeting Technical Digest, San Francisco, Ca Dec. 11-14, 1994, 5 pages.

* cited by examiner

SHALLOW TRENCH ISOLATION PROCESS USING OXIDE DEPOSITION AND ANNEAL

CROSS REFERENCE TO RELATED APPLICATIONS

The present application is related to U.S. application Ser. No. 10/389,456 by Wang et al., filed on Mar. 14, 2003, U.S. application Ser. No. 10/341,863 by Ngo et al., filed on Jan. 14, 2003, and U.S. application Ser. No. 10/341,848 by Arasnia et al., filed on Jan. 14, 2003.

FIELD OF THE INVENTION

The present invention is related to integrated circuit (IC) devices and to processes of making IC devices. More particularly, the present invention relates to a method of forming trench isolation structures on substrates or layers including germanium.

BACKGROUND OF THE INVENTION

Integrated circuits (ICs) include a multitude of transistors formed on a semiconductor substrate. Various methods of forming transistors on a semiconductor substrate are known in the art. Generally, transistors are isolated from each other by insulating or isolation structures.

One method of forming transistors on a silicon substrate involves the well-known Local Oxidation of Silicon (LOCOS) process. A conventional LOCOS process typically includes the following simplified steps. First, a silicon nitride layer is thermally grown on the silicon substrate. Generally, conventional LOCOS processes require a high quality, thermally grown silicon nitride layer to avoid delamination and other processing problems. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the oxide only grows on the silicon substrate exposed during the source/drain patterning step. Finally, after oxide growth is complete, the remaining portions of the nitride layer are removed, leaving only the oxidized source/drain areas on the exposed silicon substrate.

Another process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner oxide is typically formed at a very high temperature in a hydrochloric (HCl) acid ambient. An insulative material, such as, silicon dioxide ($SiO_2$), is blanket deposited over the nitride layer and the liner oxide within the trench. The insulative material is polished to create a planar surface. The nitride layer is subsequently removed to leave the oxide structures within the trenches.

Shallow trench isolation (STI) structures are utilized in strained silicon (SMOS) processes. SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

The use of germanium in SMOS processes can cause germanium contamination problems for IC structures, layers, and equipment. In particular, germanium outgassing or outdiffusion can contaminate various components associated with the fabrication equipment and integrated circuit structures associating with the processed wafer. Further, germanium outgassing can negatively impact the formation of thin films. In addition, germanium outdiffusion can cause germanium accumulation or "pile-up" at the interface of the liner, thereby causing reliability issues for the STI structure.

Germanium outgassing can be particularly problematic at the very high temperatures and HCl ambient environments associated with the liner of a shallow trench isolation (STI) structure. For example, conventional STI liner oxide processes can utilize temperatures of approximately 1000° C. which enhance germanium outgassing.

Thus, there is a need for an STI liner which can be formed in a low temperature process. Further still, there is a need for a process of forming high quality oxides with good compatibility that are not susceptible to germanium outgassing. Further still, there is a need for an SMOS trench liner formation process. Yet further, there is a need for a liner formation process that is not as susceptible to germanium outgassing. Further still, there is a need for an STI process that does not utilize high temperature to thermally grow liners.

SUMMARY OF THE INVENTION

An exemplary embodiment relates to a method of manufacturing an integrated circuit. The integrated circuit includes trench isolation regions in a substrate including germanium. The method includes forming a silicon nitride layer above the substrate, and selectively etching the silicon nitride layer to form apertures associated with locations of the trench isolation (STI) regions. The method also includes forming trenches in the substrate at the locations, forming an oxide layer in the trenches in a low temperature process, and annealing the oxide layers in the trenches of the substrate.

Yet another exemplary embodiment relates to a method of forming shallow trench isolation regions in a semiconductor layer. The method includes providing a hard mask layer above the semiconductor layer, providing a photoresist layer above the hard mask layer, and selectively removing portions of the photoresist layer in a photolithographic process. The method further includes removing the hard mask layer at locations, forming trenches in the hard mask layer under the locations and forming a liner in the trenches using a deposited oxide layer in the trenches and an anneal.

Yet another exemplary embodiment relates to a method of forming a liner in a trench in a germanium containing layer. The method includes selectively etching the germanium containing layer to form the trench and providing a layer of insulative material in the trench in a low temperature process, and annealing to form the liner in the trench.

BRIEF DESCRIPTION OF THE DRAWINGS

Exemplary embodiments will become more fully understood from the following detailed description, taken in conjunction with the accompanying drawings, wherein like reference numerals refer to like parts, and wherein.

DETAILED DESCRIPTION OF REFERRED EXEMPLARY EMBODIMENTS

Figure 1:
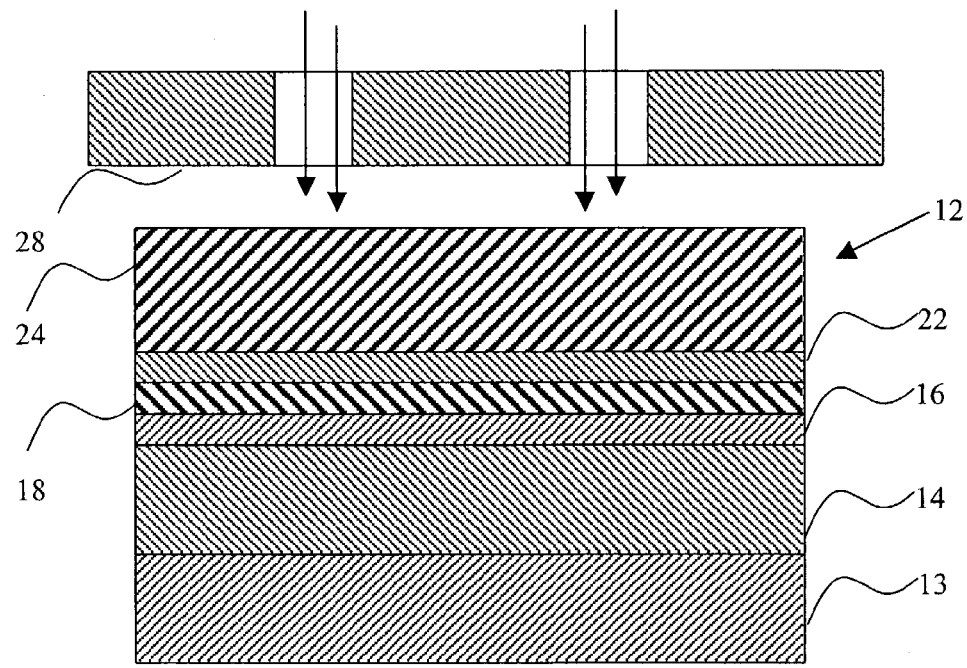
FIG. 1 is a cross-sectional view schematic drawing of a portion of a silicon germanium substrate including a strained silicon layer, an oxide layer, a hard mask layer and a photoresist layer in accordance with an exemplary embodiment of a shallow trench isolation (STI) process.

FIGS. 1 through 9 illustrate a method of manufacturing an integrated circuit (IC) in accordance with an exemplary embodiment. The method illustrated in FIGS. 1 through 9 reduces germanium outgassing and outdiffusion problems associated with silicon germanium layer on structures. The process can be used in a shallow trench isolation (STI) process or any process requiring a liner oxide and utilizing germanium or other substance prone to outgassing at high temperature. Advantageously, a liner oxide layer can be deposited at low temperature and yet provide a high quality oxide with good compatibility. For the purposes of the embodiment described with reference to FIGS. 1–9, a low temperature process refers to a process performed at a temperature of less than approximately 750° C. (e.g., at or below 700° C.).

Referring to FIGS. 1 through 9, a cross-sectional view of a portion 12 of an integrated circuit (IC) is illustrated. Portion 12 is subjected to process 100 (FIG. 9) to form a shallow trench isolation (STI) structure. Portion 12 includes an oxide layer 18 provided over a strained silicon layer 16. Layer 16 is provided over a semiconductor substrate or layer 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate, such as, a silicon substrate upon which silicon germanium substrate 14 has been grown.

Portion 12 can be any type of semiconductor device, or portion thereof, made from any of the various semiconductor processes, such as, complementary metal oxide semiconductor (CMOS) process, bipolar process, or other semiconductor process. Portion 12 may be an entire IC or a portion of an IC including a multitude of electronic component portions.

Substrate 14 is preferably a silicon germanium or other semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}$ $Ge_x$, where X is approximately 0.2 and is more generally in the range of 0.1–0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of 650° C., a disilane partial pressure of approximately 30 mPa and a germane partial pressure of approximately 60 mPa. Growth of silicon germanium material may be initiated using these ratios, or alternatively, the partial pressure of germanium may be gradually increased beginning from a lower pressure or zero pressure to form a gradient composition. Alternatively, a silicon layer can be doped by ion implantation with germanium or other processes can be utilized to form substrate 14. Preferably, substrate 14 is grown by epitaxy to a thickness of less than approximately 5000 Å (and preferably between approximately 1500 Å and 4000 Å).

A strained silicon layer 16 is formed above substrate 14 by an epitaxial process. Preferably, layer 16 is grown by CVD at a temperature of approximately 600° C. Layer 16 can be a pure silicon layer and have a thickness of between approximately 50 and 150 Å.

Pad oxide film or oxide layer 18 is provided on layer 16. Layer 18 is optional. Layer 18 is preferably thermally grown on top of layer 16 to a thickness of between approximately 100 and 300 Å. Layer 18 serves as a buffer layer and can be thermally grown in a conventional high temperature process by heating to approximately 1000° C. in an oxygen atmosphere. Germanium outdiffusion or outgassing is not a problem at this point due to the presence of layer 16.

A barrier or hard mask layer 22 is provided over oxide layer 18. Preferably, mask layer 22 is silicon nitride ($Si_3N_4$) provided at a thickness of between approximately 300 and 1000 Å by a deposition or thermal growth process. Preferably, mask layer 22 is provided in a CVD or growth process. A low pressure, plasma enhanced chemical vapor deposition (PECVD) process can also be utilized. A conventional thermal nitride process using a dichlorosilane ($SiH_2Cl_2$), ammonia ($NH_3$) and nitrogen ($N_2$) mixture at a high temperature (e.g., approximately 600° C. or above) can be used. The PECVD process for depositing nitride uses silane ($SiH_4$), nitrogen ($N_2$), and ammonia ($NH_3$) with a power of between approximately 550 and 650 watts at 500° C. An ammonia ($NH_3$) silane ($SiH_4/N_2$) mixture plasma, as opposed to a $N_2/NH_3/SiCl_2H_2$ associated with conventional CVD or growth process, can be used to form mask layer 22.

Figure 2:
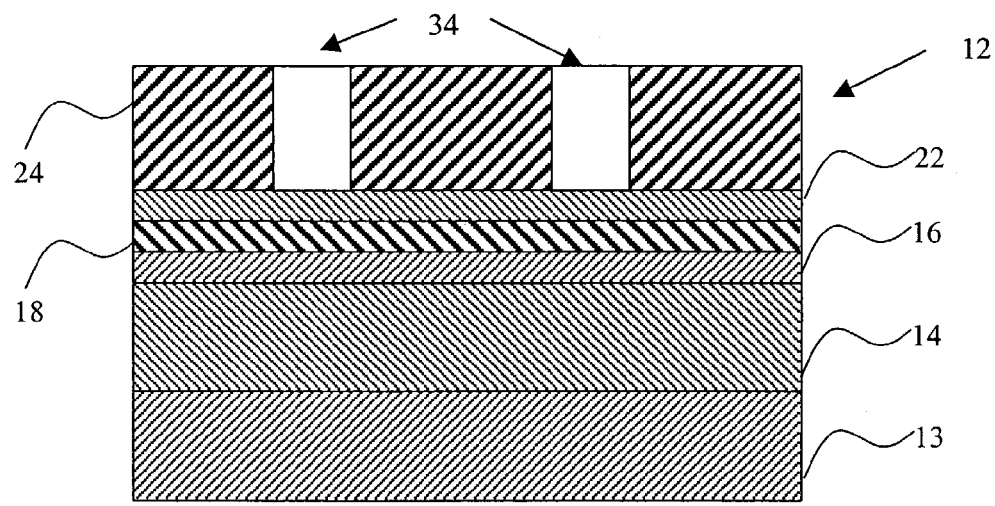
FIG. 2 is a cross-sectional view of the portion illustrated in FIG. 1, showing a lithographic patterning step.
Figure 3:
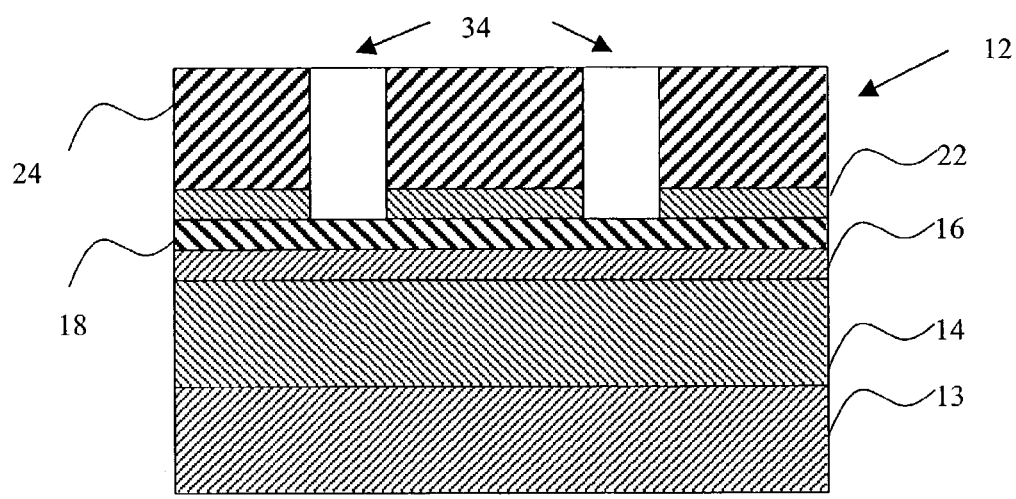
FIG. 3 is a cross-sectional view of the portion illustrated in FIG. 2, showing a selective etching step for the hard mask layer.
Figure 9:
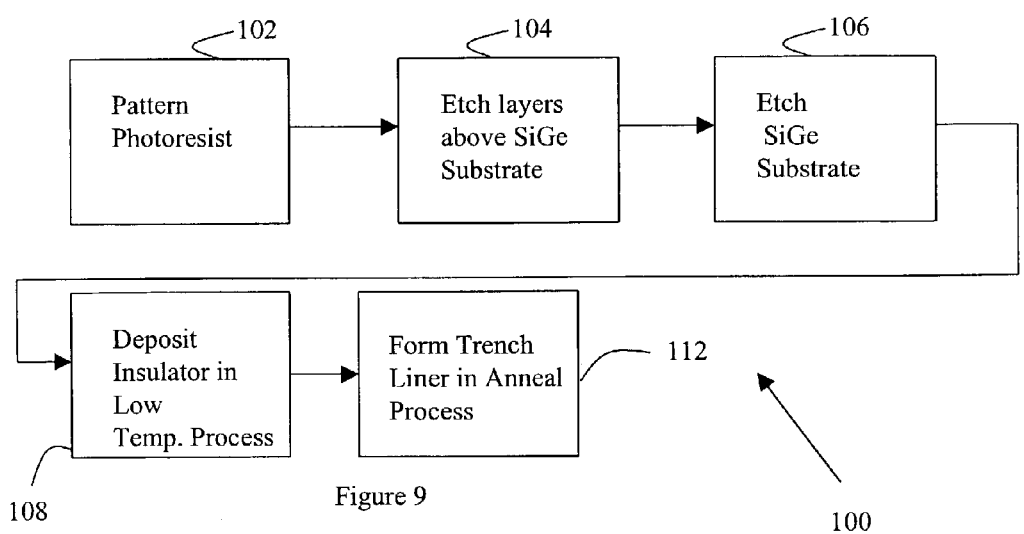
FIG. 9 is a general block diagram showing a shallow trench isolation process for the portion illustrated in FIG. 1.

A photoresist layer 24 is spun on top of mask layer 22. Preferably, photoresist layer 24 is any commercially available i-line or deep UV photoresist such as (Shipley Corp., MA) SPR 955 (i-line) UV5 (deep UV). In FIG. 2, photoresist layer 24 is selectively removed via photolithographic process using mask or reticle 28 to leave apertures 34 in accordance with a step 102 (FIG. 9) of process 100. In FIG. 3, mask layer 22 is etched via a dry etching process so that apertures 34 reach oxide layer 18 in accordance with a step 104 of process 100 (FIG. 9). The dry etching process is selective to silicon nitride with respect to oxide layer 18. Layer 24 can be stripped after mask layer 22 is etched.

Figure 4:
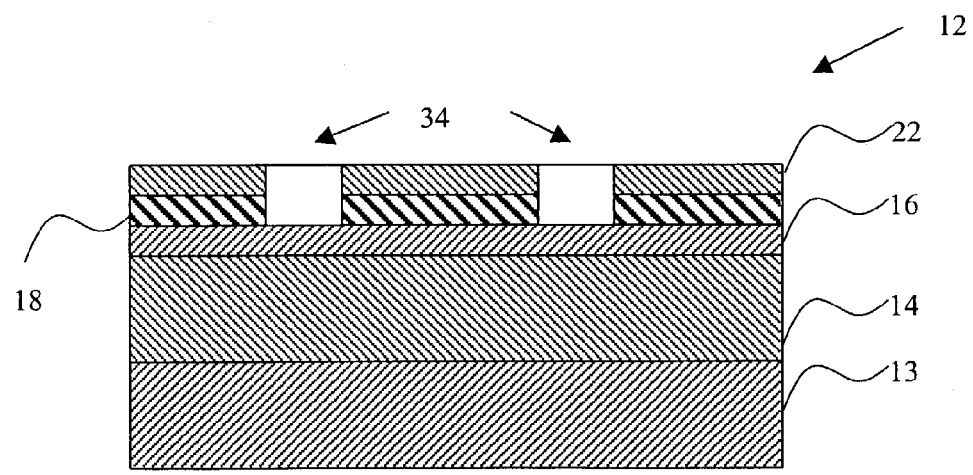
FIG. 4 is a cross-sectional view of the portion illustrated in FIG. 3, showing a selective etching step for the oxide layer.

In FIG. 4, the etch process is changed to etch through silicon dioxide material and layer 18 is etched so that apertures 34 reach layer 16 in accordance with step 104 of process 100 (FIG. 9). Layer 18 can be etched in a dry etching process. Alternatively, other etching techniques can be utilized to remove selected portions of layer 18. Photoresist layer 24 (FIG. 1) can be removed before or after oxide layer 18 is etched.

Figure 5:
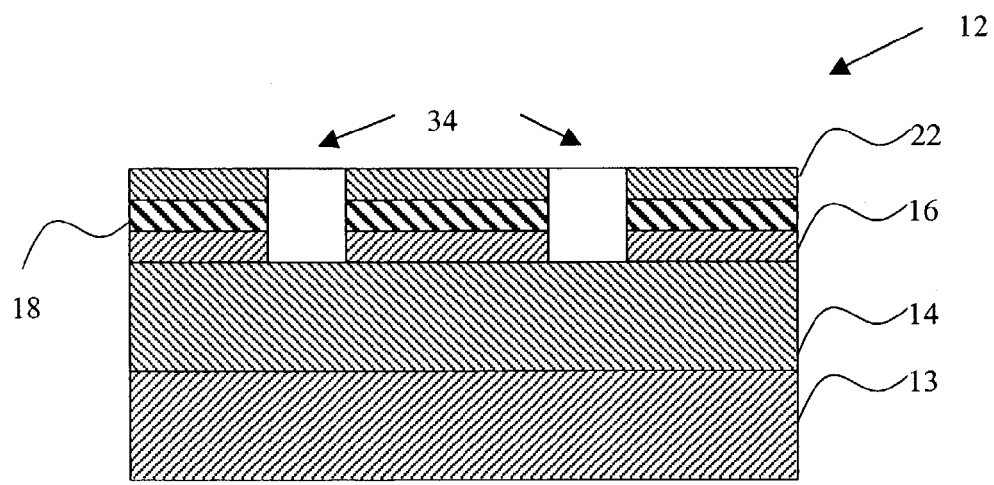
FIG. 5 is a cross-sectional view of the portion illustrated in FIG. 4, showing a selective etching step for the strained silicon layer.

In FIG. 5, the etch process is changed to etch through silicon material. Strained silicon layer 16 can be removed in accordance with a dry etching process so that apertures 34 reach substrate 14.

Figure 6:
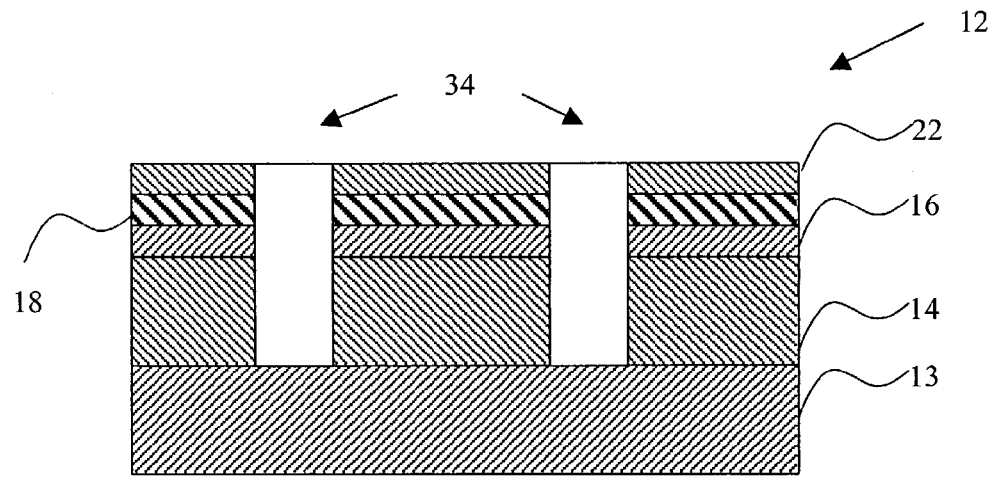
FIG. 6 is a cross-sectional view of the portion illustrated in FIG. 5, showing a selective etching step for the germanium silicon substrate.

In FIG. 6, substrate 14 is etched through apertures 34 to form trenches for shallow trench isolation structures in accordance with a step 106 of process 100 (FIG. 9). The trenches preferably have a width corresponding to apertures 34. The trenches preferably have a depth of between approximately 1500 and 4000 Å and a width of 0.18–1.50 nm or less. The trenches can have a trapezoidal cross-sectional shape with the narrower portion being at the bottom. Alternative embodiments include trenches having a trapezoidal cross-sectional shape or trenches having rounded bottoms. Substrate 14 is preferably etched in a dry etching process to form the trenches. Substrate 14 can be etched in the same step as layer 16.

Although described as being etched in a dry etching process, the trenches can be formed in any process suitable for providing apertures in substrate 14. In one embodiment, the apertures for the trenches are provided all the way through substrate 14 to substrate 13. Alternatively, the bottom of the trenches associated with apertures 34 may not reach substrate 13, depending upon the thickness of substrate 14. In an embodiment in which substrate 13 is not provided, substrate 14 is deeper than the trenches associated with apertures 34.

Figure 7:
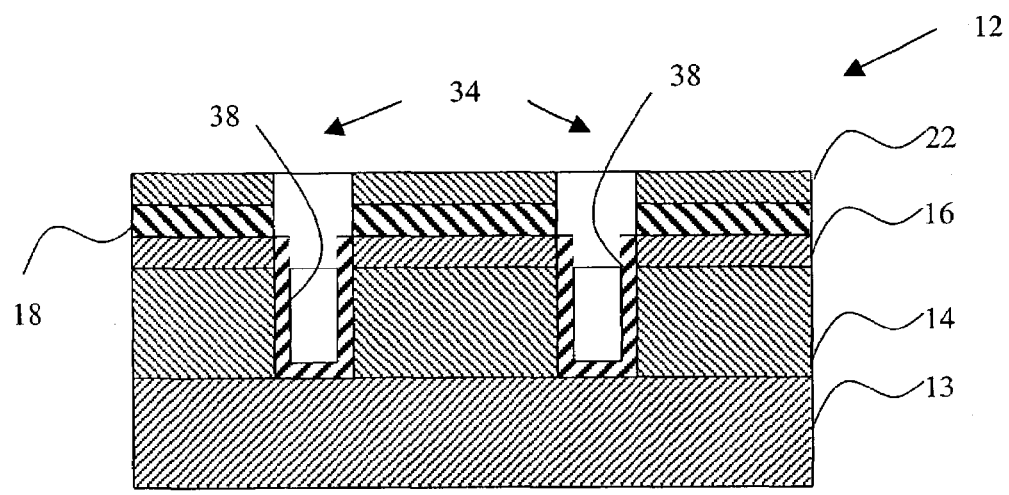
FIG. 7 is a cross-sectional view of the portion illustrated in FIG. 6, showing a low temperature liner formation step.

In FIG. 7, liners 38 are formed in the trenches associated with apertures 34. Preferably, liners 38 are oxide (e.g., silicon oxide or silicon dioxide) material formed in a low temperature process. In one embodiment, liners 38 are between approximately 200 and 500 Å thick and are provided over the bottom and side walls of the trench. In one embodiment, layers 18 and 22 are stripped before the formation of liners 38. In a preferred embodiment, layers 18 and 22 are not stripped until after the trenches are filled.

Figure 8:
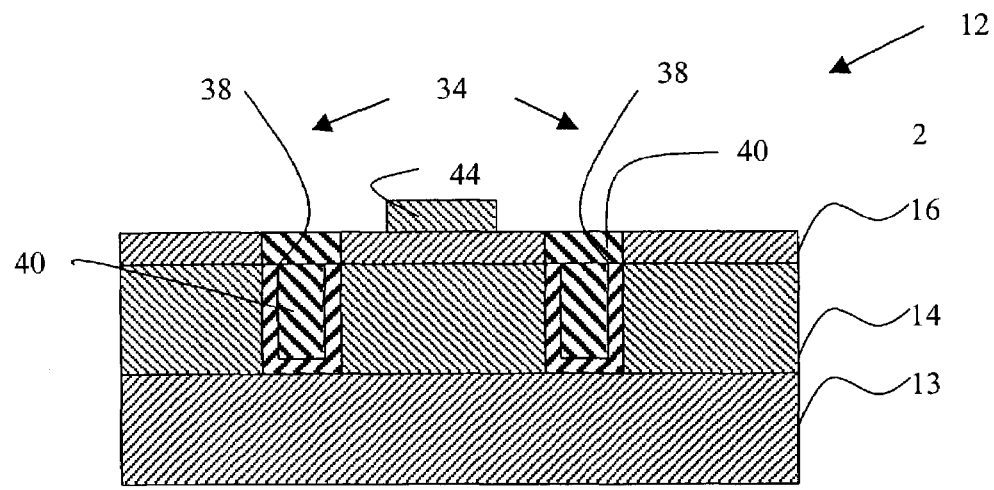
FIG. 8 is a cross-sectional view of the portion illustrated in FIG. 7, showing a gate formation step.

Liners 38 can be formed on layers 16, 18, and 22, although they are shown in FIG. 8 as being formed on substrate 14 only. An alternative embodiment includes liners 38 formed on layers 16, 18, and 22 and above mask layer 22. Liners 38 are preferably deposited. Liners 38 can be formed in a low pressure chemical vapor deposition (LPCVD) process. According to an exemplary embodiment, the deposition processes do not utilize $NH_3$, instead utilizing silane and oxygen gases at a temperature below approximately 700° C. (e.g., between approximately 600 and 650° C.). According to a preferred embodiment, the deposition process uses tetraethylorthosilicate (TEOS) gas at a flow rate of between approximately 50 and 1000 milliliters per second and oxygen gas at a flow rate of between approximately 100 and 1000 standard centiliters per minute. The temperature is between approximately 600 and 650° C. with a pressure between approximately 50 millitorr and 4 torr.

After the formation of an approximately 200–500 Å thick layer for liners 38, a quick rapid thermal anneal (RTA) or laser thermal anneal (LTA) is performed at a temperature between approximately 900 and 1000° C. for approximately 30 seconds in accordance with a step 112 at process 100. Applicant believes that the relatively short RTA time will not cause significant germanium outdiffusion or outgassing. In an exemplary embodiment in which an RTA process is utilized, a nitrogen gas ($N_2$) is introduced at a flow rate of between approximately 500 standard centiliters per minute and 5 standard liters per minute at a temperature of between approximately 925 and 975° C. for approximately 30 seconds. In another exemplary embodiment in which a LTA process is utilized, nitrogen gas is introduced at a flow rate of between approximately 500 standard centiliters per minute and 1 standard liter per minute with an LTA radiant fluence of 0.30 joules per centimeter squared (plus or minus 20%) for between 10 and 100 nanoseconds. The annealing preferably removes moisture and forms a thin layer of thermally grown $SiO_2$ between substrate 14 and liner 38.

In FIG. 8, a layer of insulative material 40 is blanket deposited over layer 16 and within the trenches associated with apertures 34. Insulative material 40 is preferably silicon dioxide deposited in a CVD process. Preferably, insulative material 40 is deposited in a tetraethylorthosilicate (TEOS) process. Alternatively, a boron phosphate silicon glass (BPSG) process can be utilized. Insulative material 40 is preferably between approximately 2000 and 8000 Å thick.

Insulative material 40 is removed by polishing/etching until a top surface of layer 16 is reached. The removal of insulative material 40 leaves oxide material within the trenches associated with apertures 34. Insulative material 40 can be removed by a number of stripping or etching processes. Preferably, insulative material 40 is removed from above layer 16 by dry-etching.

In one embodiment, insulative material 40 is deposited after the trenches are formed and before mask layer 22 is stripped. The insulative material is polished or etched until mask layer 22 is reached. Layers 22 and 18 can be stripped in a subsequent process.

Although insulative material 40 is shown in FIG. 8 as extending to top surface of layer 16, insulative material 40 can be a formed within the trenches extending only to a top surface of substrate 14.

After insulative material 40 is provided in the trenches associated with apertures 34, a gate structure 44 can be provided. Gate structure 44 can be a conventional MOSFET gate structure such as a metal over oxide gate structure or polysilicon over oxide gate structure. In one embodiment, gate structures are provided between a source and drain region.

Gate structure 44 is comprised of polysilicon doped with arsenic and is annealed in a high temperature anneal for activation (e.g., 1060° C. for 30 seconds) to suppress diffusion underneath the edge of structure 44, thereby reducing short channel effects. A low temperature NMOS anneal for As activation is utilized for the source and drain region at 900–1,000° C. for 10 seconds. A medium PMOS anneal for activation of B can be utilized at a temperature of approximately 1025° C. for 10 seconds.

In another embodiment, gate structure 44 is comprised of a gate electrode and a single crystal high-K gate dielectric material. For example, for a silicon germanium substrate 14 having approximately 70% germanium, $DySiO_3$ or $GdSiO_3$ provides a perfect lattice match to silicon germanium substrate 14 or a layer above silicon germanium substrate 14 such as layer 16. Generally, the high-k dielectric material should be chosen to have a lattice constant comparable to layer 16. This enhances mechanical support for layer 16 and allows higher germanium content within layer 16 without causing misfit dislocation. The high-k gate dielectric can be grown by molecular beam epitaxy (MBE).

In another embodiment, gate structure 44 includes a polysilicon germanium gate conductor having a lattice constant similar to the high-k gate dielectric. The germanium composition can be adjusted so that the lattice constant is comparable to the high-k gate dielectric.

It is understood that while the detailed drawings, specific examples, and particular values given provide a preferred exemplary embodiment of the present invention, it is for the purpose of illustration only. The shapes and sizes of trenches are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. A method of manufacturing an integrated circuit having trench isolation regions in a substrate including germanium, the method comprising:
   forming a silicon nitride layer above the substrate;
   selectively etching the silicon nitride layer to form apertures associated with locations of the trench isolation regions;
   forming trenches in the substrate at the locations;
   forming an oxide liner in each of the trenches in a low temperature process; and
   annealing the oxide liner in each of the trenches of the substrate.

2. The method of claim 1, further comprising providing an insulative material in the trenches to form the trench isolation regions.

3. The method of claim 2, further comprising removing the insulative material until the silicon nitride layer is reached.

4. The method of claim 1, wherein the low temperature process is an LPCVD oxide deposition process that does not utilize $NH_3$.

5. The method of claim 1, wherein the low temperature process is at a temperature at or below 700° C.

6. The method of claim 1, wherein the low temperature process uses silane and oxygen.

7. The method of claim 1, wherein the low temperature process is performed at a temperature of less than approximately 750° C.

8. The method of claim 1, wherein the third step of forming an oxide liner comprises one of a rapid thermal anneal and a laser thermal anneal.

9. A method of forming shallow trench isolation regions in a semiconductor layer, the method comprising:
   providing a hard mask layer above the semiconductor layer;
   providing a photoresist layer above the hard mask layer;
   selectively removing portions of the photoresist layer at locations in a photolithographic process;
   removing the hard mask layer at the locations;
   forming trenches in the hard mask layer under the locations; and
   forming a liner utilizing a low temperature process in the trenches using a deposited oxide layer in the trenches and an anneal.

10. The method of claim 9, further comprising providing a pad oxide layer above a strained silicon layer before the providing a hard mask layer step.

11. The method of claim 10, further comprising removing the pad oxide layer at the locations before the step of forming trenches in the hard mask layer.

12. The method of claim 9, further comprising:
   providing an insulative material in the trenches to form the shallow trench isolation regions; and
   removing the hard mask layer in a wet bath.

13. The method of claim 12, wherein the wet bath includes acid.

14. The method of claim 9, wherein the anneal is one of a rapid thermal anneal and a laser thermal anneal.

15. The method of claim 14, wherein the low temperature process is below approximately 750° C.

16. The method of claim 15, wherein the liner is silicon dioxide grown in an oxygen atmosphere.

17. A method of forming a liner in a trench in a germanium containing layer, the method comprising:
   selectively etching the germanium containing layer to form the trench;
   providing a layer of insulative material in the trench in a low temperature process to form a liner in the trench; and
   annealing the liner in the trench.

18. The method of claim 17, wherein the low temperature process is an LPCVD oxide deposition process that does not utilize $NH_3$.

19. The method of claim 17, wherein the low temperature process utilizes oxygen and at least one of silane and TEOS.

20. The method of claim 19, wherein the annealing step utilizes a temperature of approximately 1000° C.

* * * * *